United States Patent [19]
Liedberg

[11] Patent Number: 5,471,165
[45] Date of Patent: Nov. 28, 1995

[54] SIGNAL PROCESSING CIRCUIT AND A METHOD OF DELAYING A BINARY PERIODIC INPUT SIGNAL

[75] Inventor: Nils P. Å. Liedberg, Stockholm, Sweden

[73] Assignee: Telefonaktiebolaget LM Ericsson, Stockholm, Sweden

[21] Appl. No.: 201,851

[22] Filed: Feb. 24, 1994

[30] Foreign Application Priority Data

Feb. 24, 1993 [SE] Sweden .................................. 9300624

[51] Int. Cl.$^6$ .................................................. H03H 11/16
[52] U.S. Cl. .......................... 327/250; 327/237; 327/276
[58] Field of Search ..................................... 327/149, 141, 327/156, 161, 158, 276, 159, 163, 160, 161, 244, 250, 261, 277; 375/118, 120, 373–376

[56] References Cited

U.S. PATENT DOCUMENTS

| | | | |
|---|---|---|---|
| 4,795,985 | 1/1989 | Gailbreath, Jr. | 328/155 |
| 4,859,954 | 8/1989 | Yoshimura | 328/155 |
| 5,095,233 | 3/1992 | Ashby et al. | 307/603 |
| 5,159,205 | 10/1992 | Gorecki et al. | 307/269 |
| 5,173,617 | 12/1992 | Alsup et al. | 307/269 |
| 5,216,302 | 6/1993 | Tanizawa | 327/250 |
| 5,223,755 | 6/1993 | Richley | 327/250 |
| 5,250,913 | 10/1993 | Gleichert et al. | 375/120 |
| 5,295,164 | 3/1994 | Yamamura | 327/159 |
| 5,365,130 | 11/1994 | Murray et al. | 327/278 |

FOREIGN PATENT DOCUMENTS

| | | |
|---|---|---|
| 0103404 | 3/1984 | European Pat. Off. . |
| 0487902 | 6/1992 | European Pat. Off. . |
| 61-163715 | 6/1986 | Japan . |
| 1561465 | 2/1978 | United Kingdom . |
| 2130825A | 6/1984 | United Kingdom . |
| 2199457 | 7/1988 | United Kingdom . |

OTHER PUBLICATIONS

"Unsurpassed Flexibilty Heralds Clock Generator", Electronic Design, pp. 63–66 (Nov. 12, 1992), Dave Bursky.
"Double Frequency Clock Generator", IBM Technical Disclosure Bulletin, vol. 34, No. 3, pp. 55–57 (Aug. 1991).

*Primary Examiner*—Timothy P. Callahan
*Assistant Examiner*—Jeffrey Zweizig
*Attorney, Agent, or Firm*—Burns, Doane, Swecker & Mathis

[57] ABSTRACT

A signal processing circuit delays a binary periodic input signal. Three series-connected delay devices produce output signals that are delayed in relation to the input signal. The delay of the delay devices can be controlled to a very high degree of accuracy, in that the delay devices include a plurality of mutually identical series-connected delay elements which are manufactured at one and the same time by common process steps in one and the same semiconductor process. A controller compares in a phase detector the phase of the input signal with the phase of the output signal from the last delay device, and on the basis thereof delivers control signals to the delay devices. These control signals control the delay devices in a manner such that an equal number of delay elements will be activated in each of the delay devices, such that the delay devices will have mutually the same delay. The total delay between the input signal and the last output signal exceeds one-half but is less than one and a half periods of the input signal in a first regulating sequence, and the total delay reaches to one period of the input signal in a second regulating sequence.

19 Claims, 6 Drawing Sheets

Fig. 6A
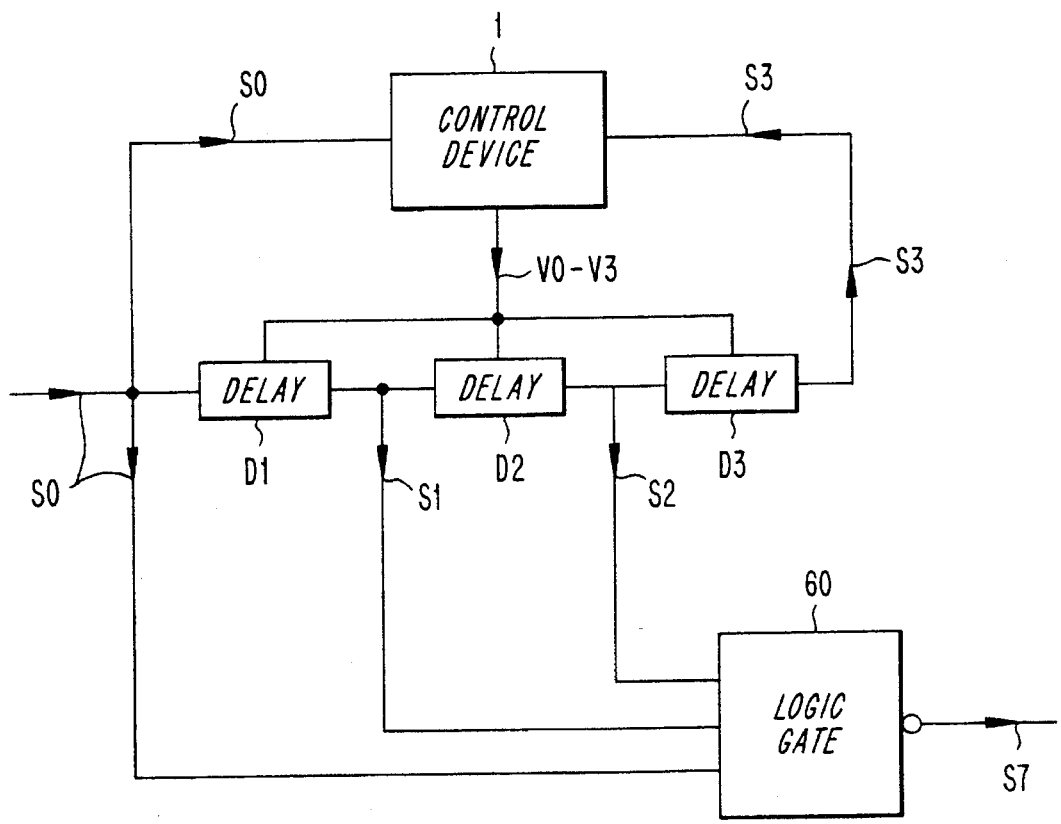
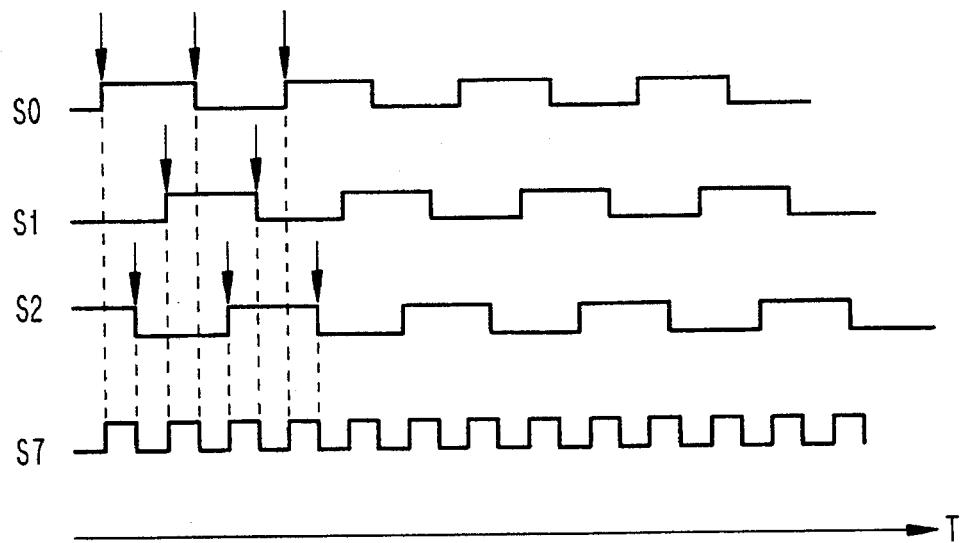
Fig. 6B

Fig. 7A
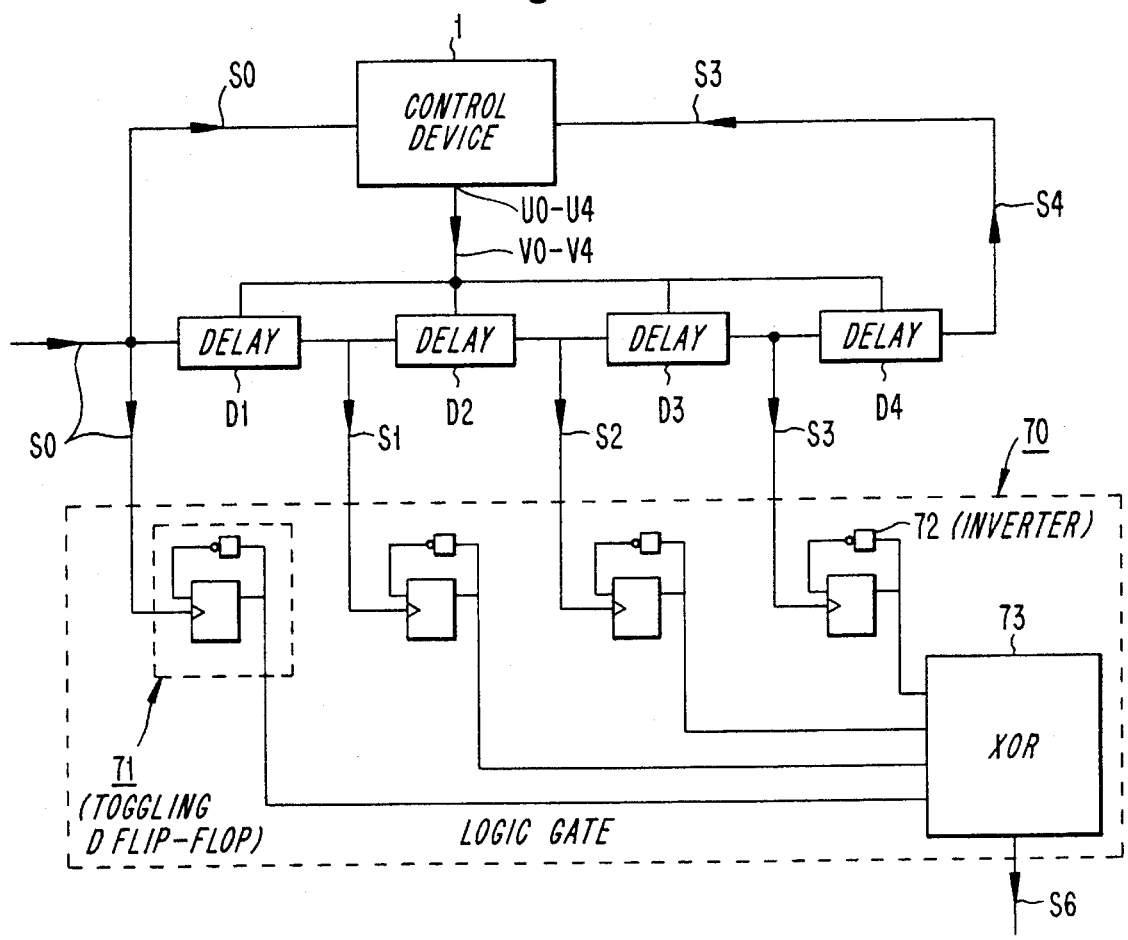
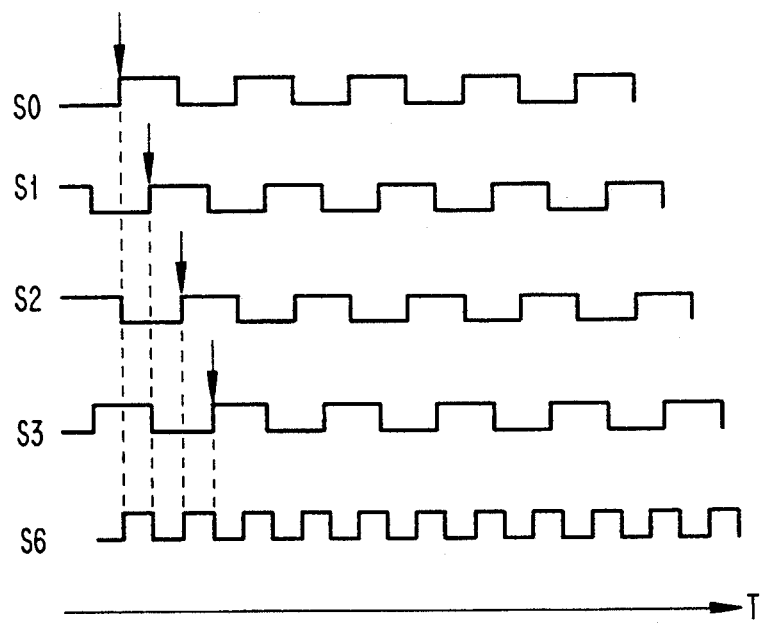
Fig. 7B

5,471,165

SIGNAL PROCESSING CIRCUIT AND A METHOD OF DELAYING A BINARY PERIODIC INPUT SIGNAL

BACKGROUND

The present invention relates to a method of delaying a binary periodic input signal using at least two series-connected semiconductor type delay devices of variable delay, and delaying the input signal successively in the series-connected delay devices, said delay devices being connected to a control means and each producing a respective output signal. The invention also relates to an arrangement for carrying out the method.

Periodic binary data signals are often used as clock signals, in which case very high demands are placed on a well-defined frequency. There is often a reason to multiply the frequency of a clock signal in order to obtain a new clock signal of higher frequency. A clock signal can be frequency multiplied by using delayed signals of an original clock signal and combining the delayed signals in a logic circuit in some suitable manner to provide a clock signal of higher frequency. One problem in this regard is that the delayed signals are not delayed accurately enough. When the delayed signals are used to extract desired signals, the deficiency in delay accuracy is propagated, thereby resulting in error in the multiplied clock signal, for instance in the form of an uneven pulse-pause-ratio. A résumé of how delayed clock signals have earlier been obtained and how frequency multiplied circuits have been produced is given below.

An article "Unsurpassed Flexibility Heralds Clock Generator" by Dave Bursky on pages 63–66 of the technical magazine Electronic Design, Nov. 12 1992, describes a circuit for generating clock frequencies. The circuit includes a phase-locked loop which comprises a phase detector, a filter, a voltage controlled oscillator, and a division circuit. The phase detector compares the respective phases of a reference signal and a feedback signal from the voltage controlled oscillator and delivers a control signal to the filter, which in turn delivers a control voltage to the oscillator. There is then produced on the oscillator output a signal which is received and divided by the division circuit, so that the divided signal obtains the same frequency as the reference signal. The voltage controlled oscillator is a ring oscillator which includes a plurality of series-connected delay elements of variable delay. Signals are tapped from the delay elements to a programmable matrix selector. The matrix selector can be programmed to provide signals whose frequencies are multiples of the reference signal frequency or signals which are delayed in relation to the reference signal.

United Kingdom Patent Application G. B. 2,199,457 A teaches a circuit for doubling the frequency of an incoming binary data signal. The data signal is delayed in a variable delay device. The data signal and the delayed data signal are then combined logically in a circuit which therewith produces an output signal whose frequency is twice that of the input signal. The output signal and the input signal are used to adjust the delay of the delay device so as to obtain a 50/50 pulse-pause-ratio.

United Kingdom Patent Application G. B. 2,130,825 A teaches a delay circuit which includes a plurality of series-connected transistors constructed in so-called $I^2L$-technique. A phase comparator compares the phase of an input signal with the phase of a delayed input signal. The delay of each transistor is corrected on the basis of this phase comparison, so as to obtain the desired delay.

United Kingdom Patent Specification G. B. 1,561,465 teaches a circuit for changing the frequency of an input signal. The input signal is first frequency-divided in a division circuit and then delayed in a delay circuit which comprises series-connected delay elements having several tapping points. The divided signal and the plurality of delayed signals are combined logically in a logic circuit, so as to obtain an output signal of desired frequency.

IBM Technical Disclosure Bulletin, Vol. 34, No. 3, August 1991, teaches a circuit for doubling the frequency of an input signal. The input signal is delayed in a delay device whose delay can be adjusted with a control voltage. The input signal and the delayed signal are combined in a logic circuit, so as to obtain a signal whose frequency is twice that of the input signal frequency. This signal and the delayed input signal are converted in a circuit, which converts the pulse-pause-ratio of the signal to voltages. These two voltages are compared in a comparator which produces the control voltage that adjusts the delay of the delay device.

Japanese Patent Publication JP 61-16 37 15 (A) teaches series-connected delay elements 1 which are used to obtain so-called multi-phase blocks. The delay elements produce delayed signals and each delayed signal is combined logically with an inverted delayed signal in a two-input AND-gate. The output signals are then used for multi-phase clocks.

Although the aforesaid publications present solutions to the problem of multiplying the frequency of a clock signal and of delaying a clock signal, the problem of generating the delayed signals that are used to extract the multiplied signal with sufficiently high accuracy still remains.

SUMMARY

The object of the present invention is to provide a signal processing circuit for delaying a binary periodic input signal to a very high degree of accuracy in the time delay. The circuit includes at least two series-connected delay devices, each of which delivers an output signal which is delayed in relation to the binary input signal. Each of the delay devices includes a plurality of series-connected delay elements. A tapping facility through which the delay device output signal can be taken out is provided downstream of each delay element. The time delay of the delay device can be varied by controlling from which tap the output signal shall be taken out. By also comparing the phase of the binary input signal with the phase of the output signal taken from one of the delay devices, it is possible to adjust the circuit so that the phase difference between the two compared signals will reach a predetermined number of half periods of the input signal, and so that each of the delay devices will obtain mutually the same time delay. All delay elements are produced simultaneously in common process stages in one and the same semiconductor process, and consequently all of the delay elements will have mutually identical delay times. This results in a very high degree of delay accuracy. The resolution of the time delay, by which is meant the ratio between the delay time of one delay element and the delay time of one delay device, can be controlled by integrating differently-sized numbers of delay elements in each delay device. The greater the number of delay elements in the delay devices, the higher the resolution obtained.

The signal processing circuit can be integrated on one and the same semiconductor chip and is well-suited for mass production. The construction is digital, which means that the phase detector will be very simple and therewith require only a small amount of space.

The accuracy in the delayed signals is increased by the present invention. When the delayed signals are used to produce a multiplied clock signal, the quality of the multiplied clock signal will also be enhanced.

The invention will be described in more detail with reference to a preferred exemplifying embodiment thereof and also with reference to the accompanying drawings.

BRIEF DESCRIPTION OF THE DRAWINGS

FIGS. 6A–6B are a block schematic illustrating an inventive arrangement for multiplying a clock signal, and an associated clock diagram.

FIGS. 7A–7B are a block schematic which also illustrates an arrangement for multiplying a clock signal, and an associated clock diagram.

DETAILED DESCRIPTION

Figure 1:
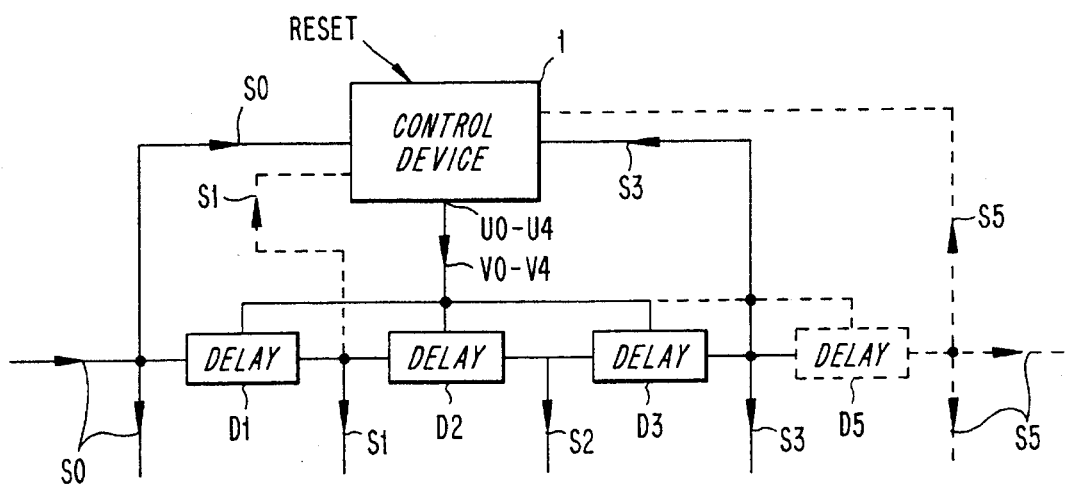
FIG. 1 is a simple block schematic illustrating a signal processing circuit which comprises a control device and three delay devices in accordance with the invention.
Figure 4:
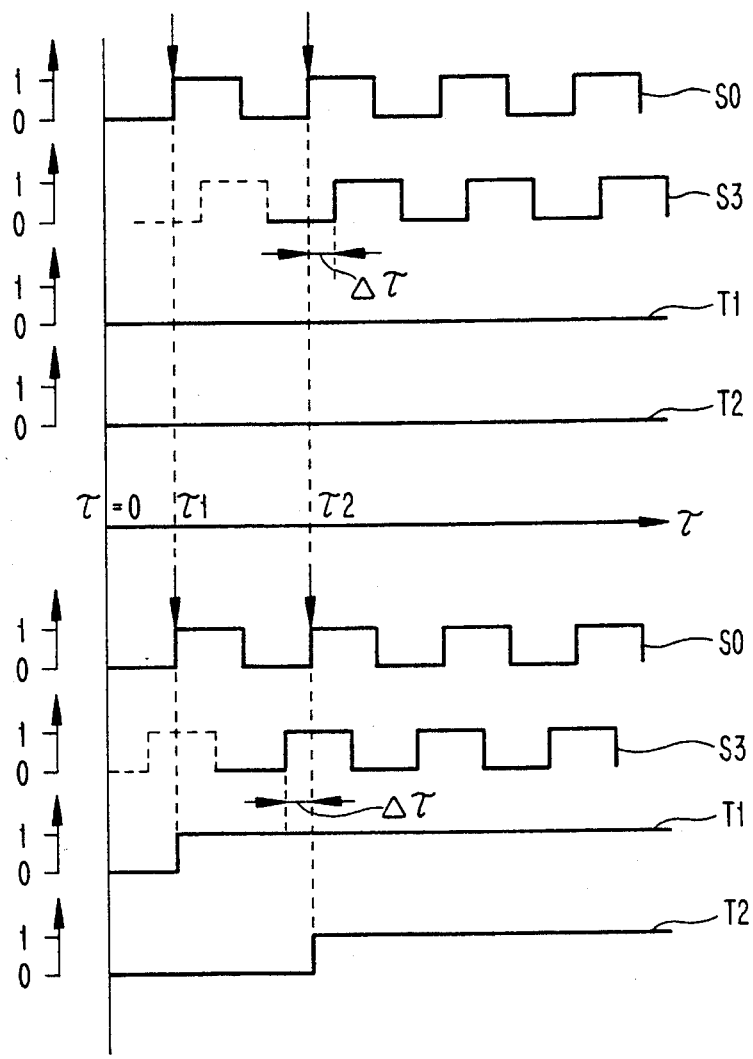
FIG. 4 illustrates two clock diagrams for the phase detector illustrated in FIG. 2.

FIG. 1 illustrates an inventive signal processing circuit and shows how this circuit operates in principle. A binary periodic input signal S0, which can assume the values 0 or 1, as shown in FIG. 4, is delayed in three series-connected delay devices D1, D2 and D3, each of which produces a respective output signal S1, S2 and S3. The delay of the delay devices can be varied by applying control signals V0–V4 from a control device 1. The phase of the signal S3 from the third delay device D3 and the phase of the input signal S0 are compared in the control device 1. There is then produced on the control outputs U0–U4 of the control device 1 control signals V0–V4, which are used to control the delay of the delay devices so that the output signal S3 from the third delay device D3 relative to the input signal S0 will be delayed by one period of the input signal and so that each of the delay devices will have a mutually identical delay time. Thus, the output signals S1, S2 and S3 will be delayed one-third period therebetween. S1 is thus delayed one-third of the period time in relation to S0 and S2 is delayed two-thirds of the period time, whereas S3 is delayed one whole of the period time. Each of the delay devices D1, D2 and D3 includes a large number of delay elements 20A–24A, shown in FIG. 2, resulting in very high delay accuracy. This is shown and explained in more detail below. It is conceivable to connect a further delay device D5 to the series-connected delay devices D1–D3, as shown in broken lines in FIG. 1. In this case, the phase of the signal S1 and the phase of the output signal S5 are conveniently compared in the control device 1. As in the earlier case, the result of this phase comparison is used to control the delay of the delay devices, although in this case so that the signal S5 will be delayed by one period in relation to the signal S1. Alternatively, the signals S0 and S3 can be delivered to the control device 1 and the signal S5 used solely as a delay signal.

Figure 2:
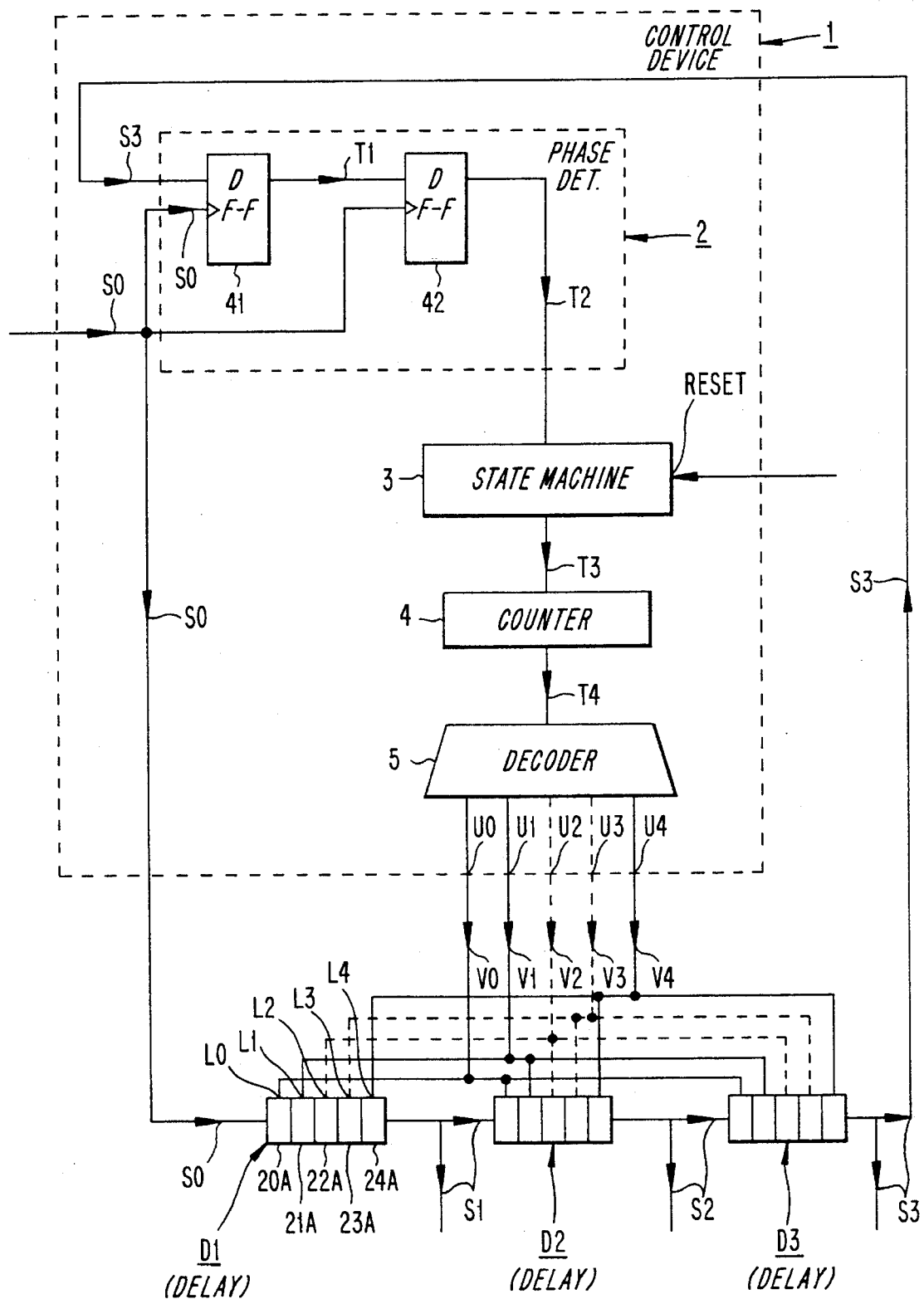
FIG. 2 shows the block schematic in FIG. 1 in more detail.

FIG. 2 illustrates an embodiment of the signal processing circuit in FIG. 1 in more detail. The control device 1 includes a phase detector 2 which receives the signal S0 and the signal S3. The phase detector compares the phases of the two signals S0 and S3 and delivers a phase signal T2, which is a logic zero when the signal S3 is delayed by more than one period of the input signal and a logic one when the signal S3 is delayed by a time which is shorter than one period of the input signal S0. The logic one or the logic zero is received by a state machine 3, which stores the signal for a number of clock periods, in this case eight clock periods. The state machine 3 then delivers a state signal T3 to a binary-type counter circuit 4 which therewith either counts up or down, depending on the value of the state signal T3. The construction and operation of the state machine will be described in more detail with reference to FIG. 5, while the operation of the phase detector will be described in more detail with reference to FIG. 4. In turn, the counter circuit 4 delivers to a decoder 5 a counter signal T4 which contains information concerning the content of the circuit 4. The decoder 5 interprets the content of the counter signal T4 and activates one of its several control outputs, referenced U0–U4, these control outputs U0–U4 delivering the respective control signals V0–V4. The Figure also shows the delay devices D1–D3. Each of the delay devices D1–D3 is comprised of a plurality of series-connected delay elements 20A–24A and each has control inputs L0–L4. The output signal can be tapped from the circuit after each delay element 20A–24A and passed directly to the input of the next following delay device, or to the phase detector 2 for phase comparison when the output signal is the output from the last delay device D3.

The control output U0 of the decoder 5 is connected to the control input L0 of each of the delay devices D1–D3. Correspondingly, the remaining control outputs U1–U4 of the decoder are connected to the corresponding control inputs L1–L4 of each of the delay devices. The control signals V0–V4 which control the delay of the delay devices are produced on the control outputs U0–U4 of the decoder 5. The decoder 5 thus controls the delay of the delay devices D1–D3 simultaneously and in a manner such that the delay devices will each produce mutually the same delay, because an equally large number of delay elements are activated in each delay device D1–D3. The delay elements 20A–24A namely produce mutually the same delay, as will be explained in more detail with reference to FIG. 3. The combined delay of all delay devices D1–D3 is equal to one period of the input signal, which is obtained with the aid of the adjustment achieved through the phase detector 2.

Figure 3:
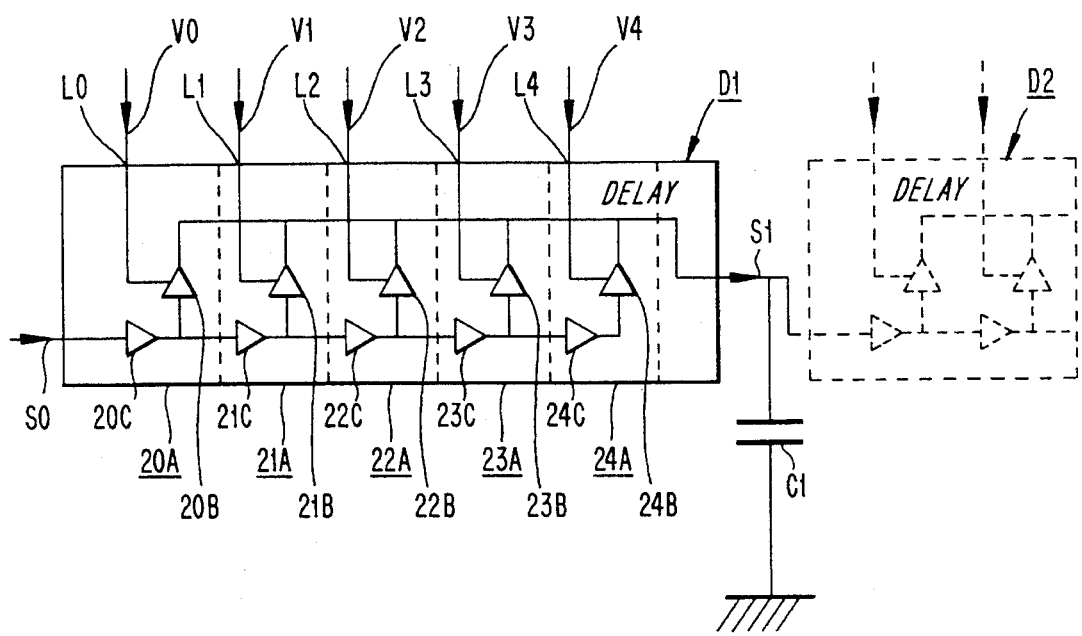
FIG. 3 is a circuit diagram of a delay device included in the FIG. 1 illustration.

FIG. 3 illustrates in more detail an exemplifying embodiment of the variable delay device D1 shown in FIG. 1. The delay device includes the aforesaid series-connected delay elements 20A–24A, which in turn include series-connected delay buffers 20C–24C and buffer elements 20B–24B which are connected to the decoder 5 through control inputs L0–L4. The input signal S0 can be delayed for different lengths of time, since it passes through different numbers of delay elements 20A–24A. After each delay buffer 20C–24C, the output signal S1 can be tapped-off to the output of the delay device D1 via the buffer elements 20B–24B. For instance, the signal S0 may pass through the delay buffer 20C and then be tapped-off via the buffer element 20B. In this case, the signal has the smallest possible delay. The signal S0 may also be permitted to pass through delay buffers 20C–24C and then be tapped-off through the buffer element 24B, in which case the signal has the longest possible delay. The time delay of the delay devices is thus stepwise variable. The decoder 5 delivers one of the control signals V0–V4 from a corresponding control output of its control outputs U0–U4 to a corresponding buffer element 20B–24B. For instance, the control signal V2 is delivered from the control output U2 to the buffer element 22B. The decoder thus determines through which buffer element the signal shall be tapped, thereby enabling the buffer element which provides the requisite delay to be activated. Corresponding buffer elements 20B–24B are activated simultaneously in each of the series-connected delay devices D1–D3. The decoder 5 will preferably be constructed so that when a switch is made from one buffer element to another buffer element, the buffer element to be activated will be activated before the buffer element to be deactivated is deactivated. For instance, when a switch is to be made from buffer element 22B to buffer element 23B, the buffer element 23B is activated prior to deactivating the buffer element 22B. This avoids the presence of voltage spikes that would otherwise occur on the outputs of the delay devices D1–D3 when switching between two buffer elements. Both the delay buffers 20C–24C and the buffer elements 20B–24B can each have the form of two series-connected inverters in C-MOS technique, for instance. In this case, each of the inverters is, in turn, loaded with an inverter so as to obtain a known load for the series-connected inverters. An inverter in C-MOS technique is described in more detail in the book "Digital Teknik" by P.-E. Danielsson et al, chapter 4, page 85, published by Studentlitteratur 1977.

An extremely high degree of accuracy in the time delay is achieved with this type of delay device, because all delay elements are manufactured simultaneously in accordance with the invention in a common process stage in the same semiconductor process, preferably on one and the same semiconductor chip. This means that the delay elements 20A–24A will obtain mutually identical delay times. It is thereby ensured that the delay devices D1–D3 will delay the input signal by equal magnitudes, since an equal number of delay elements are activated in each delay device. The manner of manufacture of the delay elements is known to the art and the inventive concept includes the use of these delay elements in a method and in a signal processing circuit according to the present invention.

When the delay elements are integrated on one and the same chip, the spread between the time delay of respective delay elements 20A–24A will not be greater than some few thousandths.

It has been discovered that the delay produced by the delay elements can differ substantially in the case of different delay elements that have not been produced at one and the same time, due to variations in process parameters such as temperature and time, etc. When this is combined with variations in working temperature and operational voltage and also aging of the elements, the delay produced by the delay elements may differ by a factor of three (3) or more when the delay elements have been manufactured on different occasions or are not integrated in one and the same chip.

For the sake of simplicity, only five delay elements 20A–24A are shown in each delay device in FIG. 3. In reality, the number will be much greater. For instance, each delay device D1–D3 may contain 128 delay elements. An increase in the number of delay elements will also result in an increase in the resolution of the time delay. In this respect, the word resolution relates to the ratio between the delay time of one delay element and the maximum delay time of a delay device. In practice, the accuracy of the circuit is restricted by the resolution.

A delay device in which the delay elements are produced on one and the same chip is commercially available, as made evident in U.S. Pat. No. 5,095,233. A typical delay time of a delay element is 0.1–0.5 ns, although longer and shorter delay times can be achieved.

When switching between two delay elements, i.e. either when the number of active delay elements 20A–24A is increased or when the number of active delay elements is decreased, there is a risk that voltage spikes will occur on the output. The output line, however, counteracts this phenomenon because its intrinsic capacity maintains the value on the line when voltage spikes occur. The self-capacitance of the output of the delay device D1 is symbolized in FIG. 3 with the capacitance C1. A corresponding capacitance is found after all delay devices. Propagation of voltage spikes in the circuit can be further prevented by supplementing the self-capacitance of the line with an external capacitance. Since voltage spikes often occur when the counter circuit 4 counts up or down, the effect of voltage spikes can be further counteracted by using a counter circuit which uses a so-called Graycode. When counting up or down, a counter circuit of this kind will only change the content in one of its bits at a time, so that the smallest possible disturbances are propagated.

FIG. 4 is a clock diagram for the signals S0 and S3 and for the signals T1 and T2 of the phase detector 2, all of said signals assuming the values 0 or 1. Also shown in FIG. 4 is a time access which shows the time τ. The signal S0 is used as a binary clock signal of predetermined frequency. The signal S3 is also binary and has the same frequency as the signal S0, but is time-shifted. The phase detector 2 illustrated in FIG. 2 is used to regulate the signal S3, so as to delay the signal by one period in relation to the input signal S0. This is achieved by controlling the delay produced by the delay devices D1–D3 by the phase detector 2 via the state machine 3, the counter circuit 4 and the decoder 5.

Referring to FIG. 2, the phase detector 2 has two inputs and one output and includes two series-connected D flip-flops 41 and 42. Although the modus operandi of the D flip-flop will be well-known to the person skilled in this art, it will nevertheless be described briefly here. The D flip-flop has a clock input, a data input and a data output. It receives a binary clock signal of predetermined frequency on its clock input and a binary signal on its data input. The binary signal on the data input is read-out from the data output of the flip-flop at a positive clock edge, i.e. each time the clock signal changes from a low state to a high state. In the present case, the D flip-flops 41 and 42 receive the binary input signal S0 as the clock signal.

The phase detector 2 compares the phases of the signals S0 and S3. The signal S0 is applied to the clock input of both flip-flops, whereas the signal S3 is applied to the data input of the first D flip-flop 41. The data output of the first D flip-flop 41 produces a signal T1 and is connected to the data input of the second flip-flop 42. The second flip-flop 42 produces on its data output a phase signal T2 which is delivered to the state machine 3.

The upper part of the clock diagram in FIG. 4 shows the signal S3 excessively delayed relative to the signal S0, i.e. delayed by more than one period. This delay error is illustrated by a line referenced Δτ. The data output of the D flip-flop 41 reads-out a logic signal T1=0 at the positive edge of the input signal S0 and at time point τ1, this logic signal being received by the data input of the second flip-flop 42. The data output of the second flip-flop 42 reads-out the logic phase signal T2=0 at the next positive clock edge at time point τ2. The phase signal T2 from the output of the second flip-flop is delivered to an input of the state machine 3 according to FIG. 2. The state machine 3 produces a state signal T3 which controls or steers the counter circuit 4 at uniform intervals, where the time between each state signal T3 to the counter circuit 4 is sufficiently great to enable the adjustment, either in the form of an increase or a decrease in the number of active delay elements, to be fed into the phase detector 2. In the case of the illustrated embodiment, this time interval corresponds to eight periods of the input signal S0. When the counter circuit 4 receives the state signal T3=0, the content of the counter circuit 4 is decreased and a counter signal T4 is delivered to the decoder 5, wherewith the delay in each of the delay devices D1–D3 is decreased by deactivating the last of the active delay elements and activating the preceding delay element.

The lower part of the clock diagram in FIG. 4 illustrates the situation when the signal S3 has not been delayed sufficiently, i.e. has been delayed by less than one period in relation to the binary input signal S0. This delay error is indicated by the line Δτ. The data input of the first D flip-flop 41 receives a high signal S3 at time point τ1 when its clock input becomes high, wherein the high signal T1=1 appears on the output of the first D flip-flop 41. This signal is propagated to the data output of the second flip-flop 42 at the next positive clock edge of the signal S0 at time point τ2. The counter circuit 4 then receives the state signal T3=1 via the state machine 3, informing the circuit to count-up, whereupon the counter circuit 4 produces the counter signal T4 and the delay time is increased in each of the delay devices D1–D3, by activating a further delay element of said delay elements 20A–24A and deactivating the earlier activated delay element, in accordance with the above description made with reference to FIG. 3.

In this way, it is possible to set the delay time of the delay devices D1–D3 so that the combined delay between the signals S0 and S3 will reach one period of the input signal S0 and so that each of the delay devices D1–D3 will have the same delay. It should be noted that since the construction is digital, a delay which equals exactly one period of the input signal is not often achieved and that the delay will deviate slightly from the desired delay. This deviation is due to the aforementioned resolution of the delay devices. As a result of the limited resolution, the circuit may swing between two delay values of which one is slightly smaller than one period of the input signal S0 and the other is slightly larger than one period.

It is also conceivable to provide the phase detector with solely one D flip-flop. A phase detector of this construction, however, will present a metastability problem, i.e. a certain period of time would lapse from the moment at which the clock signal switched from a low to a high value until the data output had a stable output signal. This problem is not manifested in the embodiment illustrated in FIG. 2 which includes a further D flip-flop, and consequently this embodiment is preferred.

FIG. 2 illustrates the state machine 3, the counter circuit 4 and the decoder 5. The decoder 5 includes an input and the control outputs U0–U4 and forms part of the control device 1. The signal T4 from the counter circuit 4 is received on the input of the decoder 5 and activates one of the decoder control outputs, of which only one at a time is high, and produces the corresponding control signal, namely, one of the control signals V0–V4. The decoder control unit that is chosen from the control units U0–U4 is determined by the current value of the counter circuit 4. Each of the decoder control outputs U0–U4 is connected to one of the control inputs L0–L4 of one of the buffer elements 20B–24B of each of the delay devices. For instance, the control output U0 is connected to the control input L0 of the delay device D1 and to a corresponding control input of each of the remaining delay devices D2–D3.

It lies within the scope of the present invention to provide the signal processing circuit with more or fewer series-connected delay devices D1–D3 than three, although the circuit will include at least two series-connected delay devices. The number of control outputs on the decoder 5 shall equal the number of control inputs on the delay devices D1–D3. If the number of delay devices is increased, then the number of branches from each of the decoder control outputs U0–U4 will also be increased, so that each of the decoder control outputs is connected to a corresponding control input L0–L4 on each of the delay devices. The decoder 5 thus controls the delays of the delay devices simultaneously and in a manner such as to activate the same number of delay elements 20A–24A in each of the delay devices D1–D3.

The decoder 5 will preferably be of the kind which when a switch is made between two control signals on the control outputs, the value will be retained on the control output to be deactivated until the new control output has been activated. This time lapse is on the order of parts of a gate delay. This is achieved when the decoder switching time $t_{pHL}$ for high to low control outputs is shorter than the decoder switching time $t_{pLH}$ for low to high control outputs, i.e. when $t_{pHL}$ is $< t_{pLH}$. This results in less disturbance when switching between signals and therewith further counteracts the aforesaid problem of voltage spikes.

Figure 5:
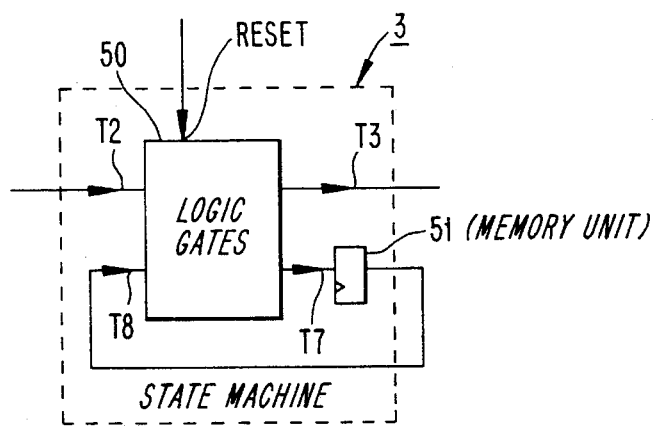
FIG. 5 is a block schematic illustrating the state machine of FIG. 2.

Before it is possible to commence phase adjustment towards a full period delay as described with reference to FIG. 4, it is necessary to set the delay of the delay devices so that the combined delay will exceed one-half period but be shorter than one and a half periods, therewith tuning the signal processing circuit to its regulating or control range. Otherwise the circuit will make the wrong adjustments. For instance, if the delay is less than one-half period the circuit may erroneously decrease the delay so that the phase difference between the signals S0 and S3 moves towards zero. Correspondingly, if the delay exceeds one and a half periods the circuit may increase the delay so that the phase difference between the signals S0 and S3 reaches two periods. The state machine is used to avoid this problem. FIG. 5 illustrates one method of implementing the state machine 3. In the case of the illustrated embodiment, the state machine 3 includes a circuit 50 which is a combinatory network of logic gates, and a memory unit 51. The circuit 50 receives at determined input time points the phase signal T2, a resetting signal RESET and a control signal T8, and produces the state signal T3 and a control signal T7. The state signal T3 is fed into the counter circuit 4 at regular intervals, wherein the time between each signal input is such as to enable the control adjustment to propagate in the signal processing circuit. In the illustrated case, this time interval corresponds to eight periods of the input signal S0. The control signal T7 is fed back to the input of the circuit 50 and at the next input time point is received as the control signal T8. When the inventive signal processing circuit is to be started-up, the counter circuit 4 is set to zero, whereupon the delay devices D1–D3 will present the smallest possible delay. This means that the signals S0 and S3 will be in phase, apart from a given smallest delay in the delay devices D1–D3, which causes the signal S3 to be delayed slightly in relation to the signal S0. The phase detector 2 will then produce the phase signal T2=0 which carries information to decrease the delay of the delay devices. Since the signal processing circuit is not in its regulating or adjustment range at this moment in time, the phase signal T2=0 will be erroneous. This is overcome because the state machine 3 receives the reset signal RESET in a first regulating or adjusting sequence during the start-up process. The circuit 50 builds its output signals T3, T7 as a function of its input signals T2, T8 and RESET and is constructed so that the circuit 50 will deliver a high state signal T3=1 to the counter circuit 4 in the first regulating sequence. The counter circuit will therewith count-up and deliver a count signal T4 to the decoder 5 in accordance with FIG. 2, wherewith the decoder 5 produces one of the control signals V0–V4 which increases the delay of the delay devices D1–D3. This continues until the phase detector produces the phase signal T2=1 for the first time after starting-up the processing circuit. The signal state machine 3 has then increased the delay between the signal S0 and the signal S3 to slightly more than one-half period, wherein the circuit is located in the regulating range and a second regulating sequence commences. The counter circuit 4 will preferably count-up through a further number of steps in order to ensure that the signal processing circuit is truly in its regulating range, i.e. to ensure that the delay between the input signal S0 and the signal S3 truly exceeds one-half period but is shorter than one and a half periods. In the second regulating sequence, the state signal T3 is delivered to the counter circuit 4 at regular intervals, similar to the first regulating sequence. The counter circuit 4 therewith delivers a counter signal T4 to the decoder 5 and the decoder 5, in turn, produces one of the control signals V0–V4 which changes the delay of the delay devices so that the delay between the input signal S0 and the signal S3 corresponds to one period of the input signal, as described with reference to FIG. 4.

The values of the state signal T3 can be stored in the circuit 50 and used to calculate the values of the next arriving signal. For instance, the earlier values of the state signal T3 can be used to prevent overcompensation of the state machine 3. If three mutually sequential values of the state signal T3 from the state machine are considered, for instance a first value T3=1 and a second value T3=0, the state machine may be constructed so that a new high value T3=1 will not be produced as a third value. The earlier values of the state signal T3 are thus used to determine the value of the next arriving signal and to prevent overcompensation of the signal processing circuit when the phase signal T2 constantly alternates between the value 0 and the value 1. This results in greater accuracy in the event of external disturbances and interferences and therewith in more rapid adjustment of the signal processing circuit. The stored values of the state signal T3 may also be used by the state machine 3 to calculate the mean value of eight mutually sequential state signals T3 and then determine whether the state signal T3 shall be readout as the value 1 or as the value 0 with the aid of a majority decision. Naturally, the number of state signals T3 used to form the mean value may be other than eight. According to a further modified embodiment of the invention, stored values of the state signal T3 can be used and processed in some way other than to form the mean value, whereafter the state signal T3 is delivered to the counter circuit 4.

By way of an alternative embodiment, there can be used a state machine which sets the delay of the delay devices so that the delay between the input signal S0 and the signal S3 in the second regulating sequence will reach a predetermined number of half periods of the input signal S0. For instance, the delay between the input signal S0 and the signal S3 in the second regulating sequence may reach one and a half periods of the input signal S0 or two periods of the input signal S0. In this case, the state machine 3 is constructed so that the signal processing circuit will switch to the second regulating sequence when the requisite delay has been obtained, i.e. when the delay lies within a regulating interval that has its centre at the predetermined number of half periods of the input signal S0, this regulating interval reaching to less than one period of the input signal S0.

For instance, when using a signal processing circuit in which the delay between the input signal S0 and the signal S3 shall reach one and a half periods in the second regulating sequence, the signal processing circuit switches to the second regulating sequence when the delay between the input signal S0 and the signal S3 exceeds one period but is less than two periods of the input signal S0, i.e. when the delay lies within one regulating interval which has its centre at one and one-half period of the input signal S0, this regulating interval reaching to less than one period of the input signal S0. In this case, the state machine 3 is constructed to switch to the second regulating sequence after first having received a phase signal T2=1 and thereafter a phase signal T2=0, i.e. two mutually sequential switches of the phase signal T2. By switching of the phase signal T2 is meant that the phase signal changes its value, either from the value T2=1 to the value T2=0 or from the value T2=0 to the value T2=1. Each switch-over of the phase signal T2 corresponds to an increase in the delay between the input signal S0 and the signal S3 by one-half period of the input signal S0. Correspondingly, the signal processing circuit switches to the second regulating sequence when the delay between the input signal S0 and the signal S3 is intended to reach two periods when the state machine 3 has received three mutually sequential changes of the phase signal T2 switches in the first regulating sequence.

If the delay between the input signal S0 and the signal S3 is intended to attain a duration of one-half period in the second regulating sequence, the signal processing circuit will switch to the second regulating sequence immediately, without the phase signal T2 changing in the first regulating sequence.

According to one alternative embodiment, the first regulating sequence is omitted and the state machine 3 loads a predetermined counter value into the counter circuit 4, when the circuit receives the reset signal RESET upon starting-up the signal processing circuit. The signal processing circuit will then pass directly to the second regulating sequence, after the requisite counter value has been loaded into the counter circuit 4. This counter value is chosen so that the delay between the input signal S0 and the output signal S3 from the delay device D3 attains a delay value which deviates from a predetermined number of half periods of the input signal S0 by less than one-half period of said input signal S0. Alternatively, when starting-up the signal processing circuit, the counter circuit 4 can be loaded with a fixed counter value, for instance a counter value which corresponds to a delay of one-half period of the input signal 50, wherein the first regulating sequence is not used.

The state machine 3 can also be implemented by several other methods. For instance, a state machine which has the properties desired can be achieved with the aid of so-called HDL (Hardware Description Language). In this case, the inputs and outputs of the state machine are defined and how the circuit shall behave in HDL, for instance verilog code. The verilog code is then translated to corresponding networks of logic gates with the aid of a program, for instance synopsis. This method will be well known to those skilled in this art; see for instance the handbook "HDL Compiler for Verilog, Reference Manual, Version 2.0" published by Synopsis, March 1991.

FIG. 6A illustrates how the delay signals S0–S2 can be used to multiply the frequency of the input signal S0. The three signals S0–S2 are combined logically in a logic gate 60, for instance a modulo-2-gate followed by an inverter, although other logic gates may be used as will be readily understood by the person skilled in this art. A frequency multiplied signal S7 will then appear on the output of the logic gate 60.

FIG. 6B illustrates a clock diagram which shows how a multiplied clock signal is obtained. In the illustrated case, the logic gate output signal S7 has a frequency which is three times greater than the frequency of the original input signal S1. When the modulo-2-gate receives an odd number of high input signals (S0–S2), the gate will produce a high signal on its output. The output signal is then inverted in an inverter on the output of the modulo-2-gate. In the case of this embodiment, it can be said generally that all odd factors n 1, 3, 5, 7, and so on, can be used as multiplying factors. The number of requisite delay devices D1–D3 will then be equal to n. For instance, three delay devices are needed to multiply the frequency of the input signal S1 by three, and seven delay devices are required to multiply the frequency of the input signal S1 by seven.

FIG. 7A illustrates an alternative method of utilizing the delayed signals to multiply a clock frequency. This method is able to produce clock signals that are multiplied by a factor m which is equal to a whole number half, i.e. ½, 1, 3/2, 2, 5/2, and so on. In this case, there is used a logic gate 70 which is of different design to the logic gate 60 used in the FIG. 6 embodiment. The logic gate 70 can be implemented by activating a toggling D flip-flop 71 after each tap. By toggling D flip-flop is meant a D flip-flop which is provided with an inverter 72 between its data input and its data output. FIG. 7A illustrates an example which includes the four series-connected delay devices D1–D4. The input signal S0 is delivered to the first delay device D1 and then delayed incrementally in the series-connected delay devices D1–D4, which produce signals S1–S4. Each of the signals S0–S3 is then delivered to one of the toggling D flip-flops 71. The output signals of the D flip-flop 71 are then delivered to the XOR-gate 73, wherewith the desired signal S6 is obtained on the output of the XOR-gate 73. An XOR-gate will produce a high output signal when one, and only one, of its input signals is high.

The advantage afforded by this method is that the introduction of the toggling D flip-flops obviates the dependency on the negative clock edge of the input signal S0 and therewith also the dependency on the pulse-pause-ratio of the input signal S0. This is achieved because each positive edge of the signals S0–S3 forms alternately a positive or a negative clock edge on the output signal S6, as illustrated in the associated clock diagram shown in FIG. 7B.

This latter implementation can also be used to smooth out the pulse-pause-ratio of a signal with which said ratio is uneven. In this case, there are used two series-connected delay devices D1 and D2 which produce the signals S1 and S2 respectively, according to FIG. 8A. An input signal S8 which has an uneven pulse-pause-ratio is shown in the clock diagram. The output signal S6 from the XOR-gate 73 has a 50/50 pulse-pause-ratio.

Thus, the embodiment illustrated in FIG. 6 enables a clock signal to be readily multiplied. In order to ensure a uniform pulse-pause-ratio, the multiplied clock signal may advantageously be applied to a circuit according to the FIG. 8A, embodiment. This circuit is a variant of the circuit illustrated in FIG. 7A, but has only two delay devices D1 and D2.

The embodiment illustrated in FIG. 6A can also be used to achieve a given phase-shift for a clock signal, for instance a phase shift of 90 degrees. According to a further variant, the delayed clock signals can be used to obtain several phase-shifted clock signals, so-called multi-phase clocks. Other multiplying factors than those mentioned above can be obtained with the aid of an external frequency divider. For instance, a clock signal can be first multiplied by two and then frequency-divided externally by three to obtain a multiplication factor of ⅔.

Figure 8A:
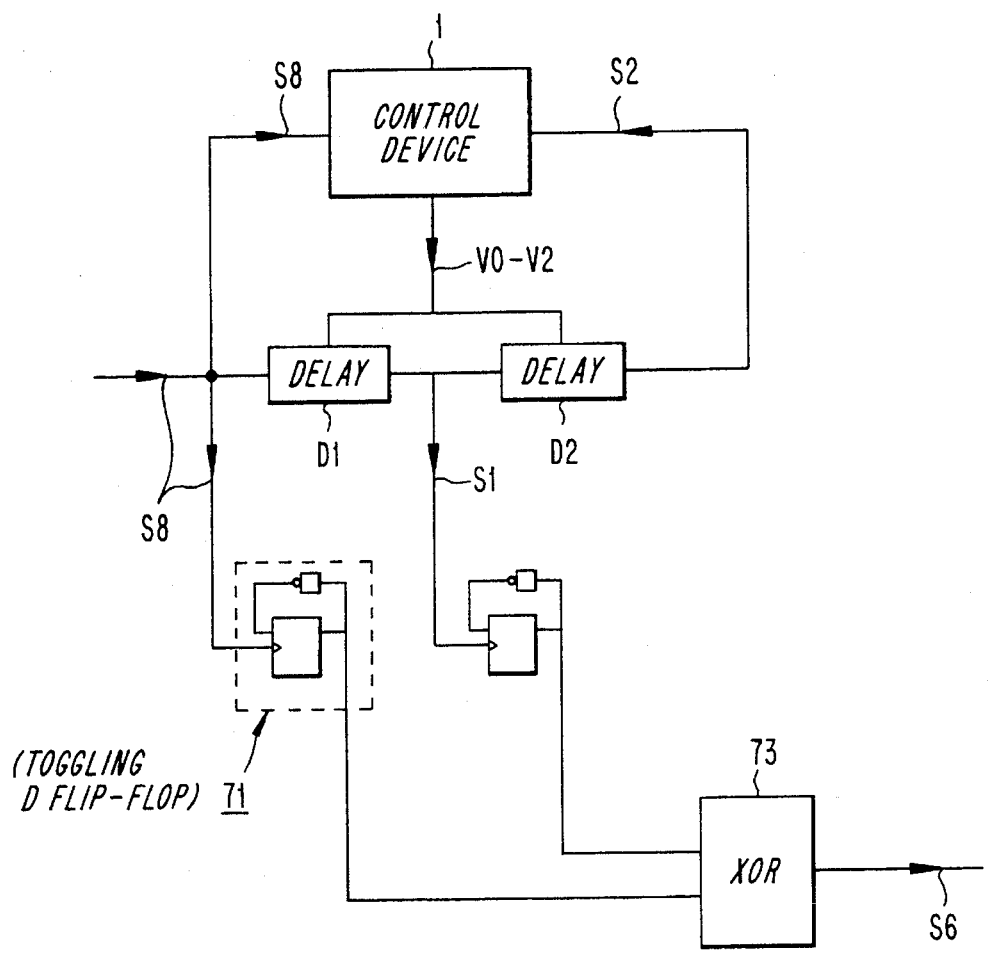
FIGS. 8A–8B are a block schematic illustrating an arrangement for equalizing the pulse-pause-ratio of a clock signal with an uneven clock signal, and an associated clock diagram.
Figure 8B:
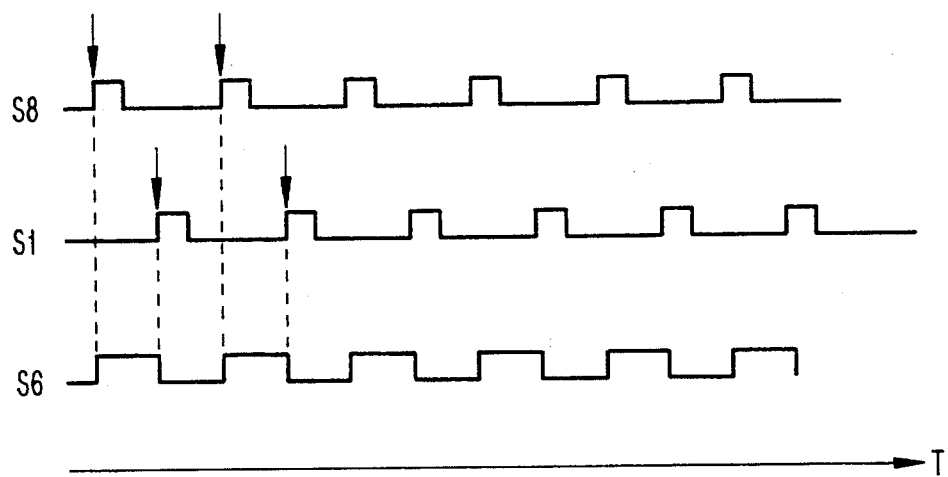

The embodiments illustrated in FIGS. 6A, 7A and 8A utilize clock signals that have been obtained with the aid of the signal processing circuit according to the present invention. The quality of the multiplied clock signals is enhanced when practicing the invention, because the accuracy of the delayed clock signals has been increased.

It will be understood that the invention is not restricted to the aforedescribed and illustrated exemplifying embodiments thereof and that modifications can be made within the scope of the following claims.

What is claimed is:

1. A method of delaying a binary periodic input signal in a digital signal processing circuit comprising delay devices and a control means, wherein at least two of the delay devices are connected in series and are semiconductor devices having a variable delay, and in which method the input signal is delayed successively in the series-connected delay devices, said delay devices being connected to the control means and each delivering a delayed output signal, the method comprising the steps of:

forming each of the delay devices by connecting in series a plurality of delay elements all of which are manufactured at a same time by a common process step in a same semiconductor process, so that the delay elements will have mutually a same delay time;

comparing a phase of the binary periodic input signal with a phase of the output signal of an indicated delay device, said phase comparison being carried out in a phase detector in the control means;

generating control signals in the control means in correspondence with the phase comparison;

delivering the control signals from control outputs of the control means to each of the series-connected delay devices;

in a second regulating sequence, using the control signals from the control outputs of the control means to activate a number of delay elements such that a delay between the input signal and the output signal from the indicated delay device will reach a predetermined number of half periods of the input signal; and using the control signals to activate an equal number of delay elements in each of the series-connected delay devices.

2. A method according to claim 1, wherein the second regulating sequence is preceded by a first regulating sequence comprising the step of using the control signals from the control outputs of the control means to activate a number of delay elements such that the delay between the input signal and the output signal from the indicated delay device will reach a delay value that differs from the predetermined number of half periods of the input signal by less than one-half period of the input signal.

3. A method according to claim 2, wherein:

the control means includes a state machine, a counter circuit and a decoder; and the control signals in the first regulating sequence are generated by the steps of:

setting the counter circuit to zero;

supplying a resetting signal to the state machine;

the phase detector delivering to the state machine a phase signal that is contingent on the phase comparison and which can alternatively take each of a first value and a second value in dependence on the delay of the output signal from the indicated delay device;

the state machine delivering to the counter circuit a state signal that can alternatively take each of a first value and a second value in dependence on a number of changes of the phase signal;

the counter signal delivering to the decoder a counter signal corresponding to the value of the state signal;

the decoder decoding the counter signal and delivering the control signals corresponding to the counter signal to the control outputs of the control means;

the control signals counting up the delay of the delay devices; and readjusting the state machine so as to terminate the first regulating sequence when the delay between the input signal and the output signal from the indicated delay device reaches said delay value.

4. A method according to claim 2, wherein:

the control means includes a state machine, a counter circuit and a decoder; and in the first regulating sequence the step of using the control signals to activate the delay elements comprises the steps of:

the state machine receiving a reset signal;

the state machine delivering to the counter circuit a state signal corresponding to the reset signal, that loads the counter circuit with a predetermined counter value;

the counter circuit delivering to the decoder a counter signal that is dependent on the predetermined counter value;

the decoder decoding the counter signal and delivering the control signals corresponding to the counter signal, via the outputs of the control means;

the control signals activating delay elements in each of the delay devices, wherein the number of delay elements activated is dependent on the predetermined counter value; and readjusting the state machine so that the first regulating sequence is terminated when the state machine receives a phase signal from the phase detector subsequent to the delay elements being activated in dependence on the predetermined counter value.

5. A method according to claim 1, wherein:

the control means includes a state machine, a counter circuit and a decoder; and the control signals are generated in the second regulating sequence by the steps of:

the phase detector delivering to the state machine a phase signal which is dependent on the phase comparison and which can alternatively take a first value and a second value, wherein the phase signal takes its first value when the output signal from the indicated delay device is delayed by less than the predetermined number of half periods of the input signal, and wherein said phase signal takes its second value when the output signal from the indicated delay device is delayed by more than the predetermined number of half periods of the input signal;

the state machine delivering to the counter circuit a state signal that alternatively takes a first value and a second value in dependence on the value of the phase signal, wherein the content of the counter circuit is increased when the state signal takes its first value and the content of said counter circuit is decreased when the state signal takes its second value;

the counter circuit delivering to the decoder a counter signal which corresponds to the content of the counter circuit; and the decoder decoding the counter signal and delivering the control signals corresponding to the counter signal, via the outputs of the control means.

6. A method according to claim 3, wherein:

a number of the state signal values are stored in the state machine;

the state machine alternatively generates the first state signal value or the second state signal value in dependence on the values of the stored signals; and the generated value is delivered to the counter circuit.

7. A method according to claim 1, wherein changing the delay of the delay devices includes the steps of:

the control signals activating at a first predetermined time point a first delay element in each of the delay devices in dependence on the phase comparison, said first delay element determining the delay of the delay devices;

the control signals activating a new delay element in each of the delay devices at a next following predetermined time point, wherein the first delay element is deactivated subsequent to activation of the new delay element.

8. A method according to claim 3, wherein the phase detector delivers the phase signal to the state machine at time points which correspond to each positive edge of the binary periodic input signal.

9. A method according to claim 1, wherein the control means controls the delay devices so that the number of activated delay elements in each of the delay devices will alternatively decrease or increase by one.

10. A digital signal processing circuit comprising: delay devices and control means for delaying a binary periodic input signal, wherein at least two of the delay devices are connected in series and are semiconductor devices having a variable delay and are connected to the control means, each of said delay devices having an input and an output, wherein:

each of the delay devices includes a plurality of series-connected delay elements;

the delay elements in all delay devices are manufactured at a same time by a common process step in a same semiconductor process, so that the delay elements will have mutually a same delay time;

the control means has a first input connected to an input of one of the delay devices on which it receives an input signal to said one delay device, a second input connected to the output of an indicated delay device, on which second input the control means receives an output signal from the indicated delay device, and control outputs connected to control inputs of each of the delay devices;

the control means includes a phase detector for making a phase comparison between the input and output signals arriving on both inputs of the control means;

the control means, in response to the phase comparison, delivers control signals that, in a second regulating sequence, activate delay elements in a number such that a delay between the input signal and the output signal from the indicated delay device will reach a predetermined number of half periods of the input signal; and the control means delivers the control signals in a manner such as to activate an equal number of delay elements in each of the series-connected delay devices.

11. A digital signal processing circuit according to claim 10, wherein:

on the basis of the phase comparison, the control means delivers on its control outputs the control signals, that in a first regulating sequence preceding the second regulating sequence, activate a number of delay elements such that the delay between the input signal and the output signal from the indicated delay device will reach a delay value that differs from the predetermined number of half periods of the input signal by less than one-half period of the input signal.

12. A signal processing circuit according to claim 11, wherein:

the control means includes a state machine, a counter circuit and a decoder, each of which has at least one input and at least one output; and in the first regulating sequence:
the counter circuit is set to zero;
the state machine receives a reset signal;
the output of the phase detector is connected to the input of the state machine, said phase detector delivering from its output to the state machine a phase signal that is dependent on the phase comparison and that alternatively takes a first value and a second value, the phase signal changing value in dependence on the delay of the output signal from the indicated delay device;
the output of the state machine is connected to the input of the counter circuit, said state machine delivering to the counter circuit a state signal that alternatively takes each of a first value and a second value in dependence on a number of changes of the phase signal;
the output of the counter circuit is connected to the input of the decoder, said counter circuit delivering to the decoder a counter signal that is dependent on the value of the state signal;
the outputs of the decoder are connected to the control outputs of the control means, said decoder decoding the counter signal and delivering the corresponding control signals which count-up the delay of the delay devices; and
the state machine is readjusted so that the first regulating sequence will be terminated when the delay between the input signal and the output signal from the indicated delay device reaches said delay value.

13. A signal processing circuit according to claim 11, wherein:

the control means includes a state machine, a counter circuit and a decoder, each of which has at least one input and at least one output; and in the first regulating sequence:
the state machine receives a reset signal;
the state machine output is connected to the counter circuit input, wherein said state machine delivers to the counter circuit a state signal that corresponds to the reset signal and loads the counter circuit with a predetermined counter value;
the counter circuit output is connected to the decoder input, wherein the counter circuit delivers to the decoder the counter signal that is dependent on the predetermined counter value; and
the decoder outputs are connected to the control outputs of the control means, wherein the decoder decodes the counter signal and delivers the control signals that correspond to the counter signal, wherein the decoder also delivers control signals in a manner such as to activate delay elements in each of the delay devices in numbers which depend on the predetermined counter value, and wherein the state machine is readjusted so that the first regulating sequence is terminated when the state machine receives a phase signal from the phase detector subsequent to having activated the delay elements in dependence on said predetermined counter value.

14. A signal processing circuit according to claim 10, wherein:

the control means includes a state machine, a counter circuit and a decoder, each of which has at least one input and at least one output;

in the second regulating sequence, the phase detector output is connected to the state machine input, said phase detector delivering from its output to the state machine a phase signal that is dependent on the phase comparison and that alternatively takes a first value and a second value, wherein the phase detector delivers its first value when the output signal from the indicated delay device is delayed in relation to the input signal by less than the predetermined number of half periods of the input signal, and the phase detector delivers its second value when the output signal from the indicated delay device is delayed in relation to the input signal by more than the predetermined number of half periods of the input signal;

the outputs of the state machine are connected to the input of the counter circuits, wherein the state machine delivers to the counter circuit a state signal in dependence on the value of the phase signal, wherein said state signal alternatively takes a first value and a second value, wherein the content of the counter circuit is increased when the state signal takes its first value and is decreased when the state signal takes its second value;

the output of the counter circuit is connected to the input of the decoder, wherein the counter circuit delivers to the decoder a counter signal containing information relating to the content of the counter circuit; and the inputs of the decoder are connected to the control outputs of the control means, wherein the decoder decodes the counter signal delivers from its outputs control signals that correspond to the counter signal.

15. A signal processing circuit according to claim 12, wherein:

the state machine stores a plurality of state signal;
the state machine alternatively generates the first value or the second value of the state signal in dependence on the values of the stored signals; and the state machine delivers the generated value to the counter circuit.

16. A signal processing circuit according to claim 10, wherein:

when a change occurs in the delay of the delay devices, the control means delivers the control signals in a manner so as to activate at a first predetermined time point a first delay element in each of the delay devices in dependence on the phase comparison, said first delay element determining the delay of the delay devices; and the control means delivers the control signals in a manner so as to activate a new delay element in each of the delay devices at a next following predetermined time point, said control means deactivating the first delay element subsequent to said control means having activated the new delay element.

17. A signal processing circuit according to claim 12, wherein the phase detector delivers the phase signal to the state machine at time points that correspond to each positive edge of the binary periodic input signal.

18. A signal processing circuit according to claim 10, wherein a capacitor is disposed at the output of each of the delay devices.

19. A signal processing circuit according to claim 10, wherein the control means controls the delay devices in a manner such that the number of delay elements activated in each of the delay devices is alternatively decreased or increased by one.

* * * * *